RE 25559

Sept. 22, 1959 L. R. TRAVIS ET AL 2,905,014

REMOTE CONTROL APPARATUS

Filed June 15, 1956 2 Sheets-Sheet 1

WITNESSES:
Bernard R. Giegucz
Leon M. Garman

INVENTORS
Lawrence R. Travis and
William R. Petrick.
BY J. J. Callahan
ATTORNEY

Sept. 22, 1959 L. R. TRAVIS ET AL 2,905,014

REMOTE CONTROL APPARATUS

Filed June 15, 1956 2 Sheets-Sheet 2

United States Patent Office 2,905,014

Patented Sept. 22, 1959

2,905,014

REMOTE CONTROL APPARATUS

Lawrence R. Travis, Fanwood, and William R. Petrick, Kenilworth, N.J., assignors to Westinghouse Electric Corporation, East Pittsburgh, Pa., a corporation of Pennsylvania Application June 15, 1956, Serial No. 591,728

9 Claims. (Cl. 74—472)

This invention relates to remote control systems and more particularly to a remote control system for television receivers and the like.

Various remote control systems have been proposed for actuation of the controls of a television receiver, but most of them have had serious limitations. Prior art apparatus designed for actuation of the channel-selection shaft of a television receiver from a remote point are generally expensive. Furthermore, apparatus of the above type usually employ an actuation of the channel-selection shaft which is performed at a constant rate of speed. Apparatus utilizing this manner of actuation is severe on the tuner of the receiver.

It is an object of our invention, therefore, to provide means for controlling the angular movement of a shaft in a constant acceleration and deceleration manner.

It is another object of our invention to provide means for controlling the angular movement of the tuning shaft of a television receiver from a remote point in a constant acceleration and deceleration manner.

It is still another object of our invention to provide a remote control system which permits tuning of a television receiver from a remote point which is low in cost and satisfactory in operation.

It is still another object of our invention to provide a remote control system to enable operation of a television receiver to be controlled from a remote point, such remote control operation including channel selection, fine tuning and volume control of the receiver, which is low in cost and has a minimum of remote control or auxiliary mechanism.

It is still another object of our invention to provide a remote control system for the actuation of a tuner of a television receiver that is comparatively less severe in operation on the tuner.

It is still another object of our invention to provide a remote control system to enable a television receiver to be controlled in its channel selection operation from a remote point, such system being designed so that it does not interfere with the local control of the receiver.

It is still another object of our invention to provide a remote control system to enable a television receiver to be controlled from a remote point in its channel selection, fine tuning and volume control operations, such system being designed so that it does not interfere with local control of the receiver.

It is a still further object to provide a remote control system for the tuner of a television receiver in which the channels to be tuned in by remote control may be preselected easily by an operator of the receiver.

It is a still further object of our invention to provide a remote control system for the tuner of a television receiver in which preselected channels may be easily bypassed by an operator of the receiver.

These and other objects are effected by our invention as will be apparent from the following description taken in accordance with the accompanying drawings throughout which like reference characters indicate like parts, and in which.

Figure 1:
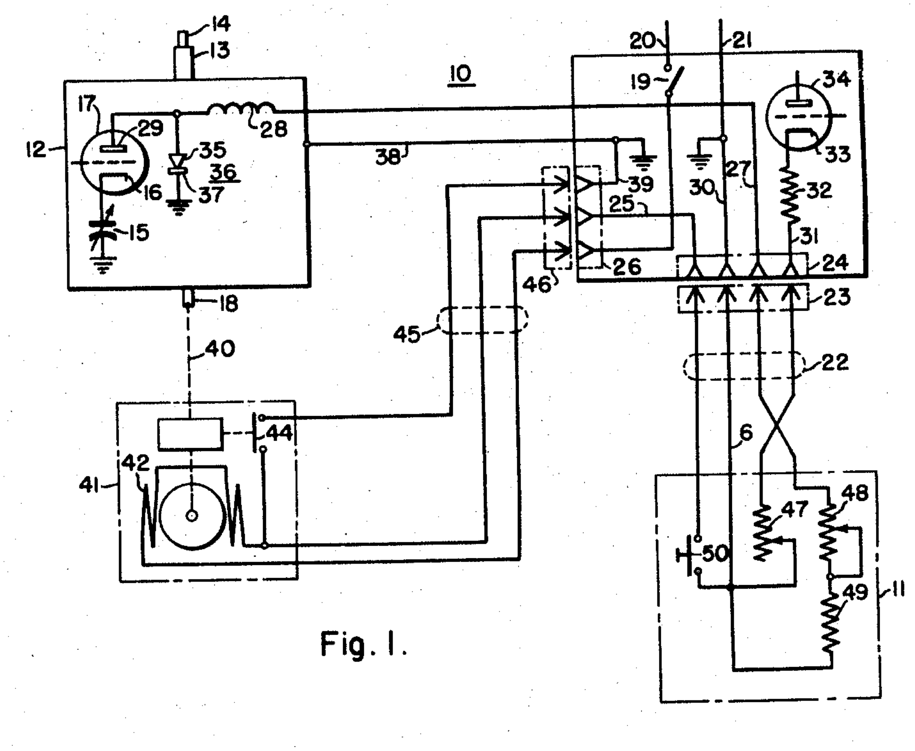
Figure 1 is a schematic and circuit diagram showing our remote control system.

Referring to Fig. 1 in detail, a television receiver 10 is provided with control means for turning it on and off, for selection of the desired station channel, for fine tuning of the selected station channel, and for adjusting the audio volume.

In this invention, as hereinafter explained, these control means may be selectively actuated by an operator either at the receiver by adjustment of appropriate control shafts or at a location remote from the receiver by the adjustment of control elements provided within a remote control unit 11.

The television receiver 10 is provided with a tuner 12 having concentric outer and inner shafts 13 and 14 extending from the front thereof and adapted to project through a suitable aperture provided in the receiver cabinet (not shown). The inner shaft 14 may be adjusted at the receiver to provide for fine tuning. Adjustment of the inner shaft 14 may control the variable capacitor 15 connected between the cathode 16 of the oscillator tube 17 and ground potential. The outer shaft 13 may be adjusted at the receiver to select a desired station channel. The outer shaft 13 is provided with a portion 18 adapted to project through the back of the tuner 12 and to be coupled to a drive mechanism so that desired station channels may be selected from a remote location. Another control shaft may be provided (not shown), the adjustment of which allows an operator to actuate an on-off switch 19 and additionally may serve as a means to adjust the audio volume to a desired level.

The receiver 10 is connected by power supply leads 20 and 21 to the available alternating current power line, usually a 110 volt, 60 cycle line. The remote control unit 11 is energized by means of a cable 22 which is adapted to extend through the back cover of the receiver to the remote control unit 11. The cable 22 is provided with a plug 23 adapted to be inserted in a socket 24 located at the receiver. From the socket 24 a lead 25 may be traced to another receiver socket 26, another lead 27 may be traced through an inductance 28 to the plate 29 of tube 17, another lead 30 may be traced to the power supply lead 21 which in turn is connected to ground potential, and another lead 31 may be traced to one end of a resistor 32, the other end of resistor 32 which is connected to the cathode 33 of audio power amplifier tube 34. The plate 29 of the tube 17 is connected to the plate 35 of a frequency control element 36. The cathode 37 of element 36 is connected to ground potential. The power supply lead 20 is connected through the on-off switch 19 to the socket 26. From a lead 38, which connects the tuner 12 to ground potential, a lead 39 may be traced to the socket 26.

The portion 18 of the channel-selection shaft 13 is connected through a flexible coupling 40 to channel-selection drive mechanism 41, where as hereinafter explained, the channel-selection shaft 13 may be driven or controlled at a desired rate of speed by an electric motor 42. The channel-selection drive mechanism 41, which comprises the motor 42, is mounted on a bracket 43 (Figs. 2 and 3) along with a switch 44. A cable 45 has a plug 46 which is adapted to plug into the socket 26 to supply energizing potential to the motor 42.

Remote control unit 11 is provided with a fine tuning element 48 connected as a potentiometer in series with a resistor 49 in the plate circuit of the tube 17, a volume control element 47 connected in the cathode circuit of the tube 34, and a push button switch 50.

At the remote control unit 11, an operator can initially actuate the channel-selection drive mechanism 41 by closing the switch 50. By adjustment of the volume control element 47, the operator can raise or lower the audio level. By adjustment of the fine tuning element 48, the operator can fine tune the receiver.

Figure 2:
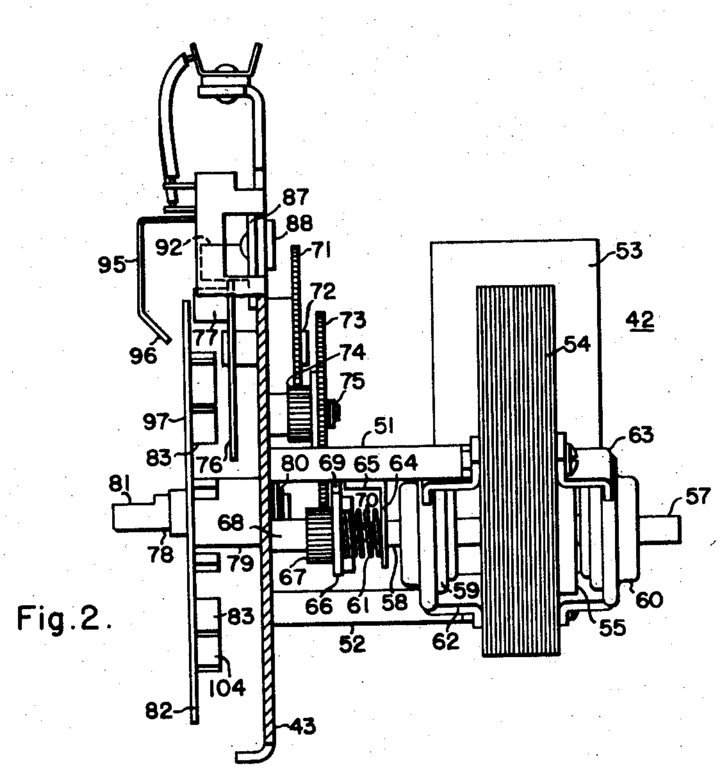
Fig. 2 is a side elevation of the drive mechanism represented in Fig. 1.
Figure 3:
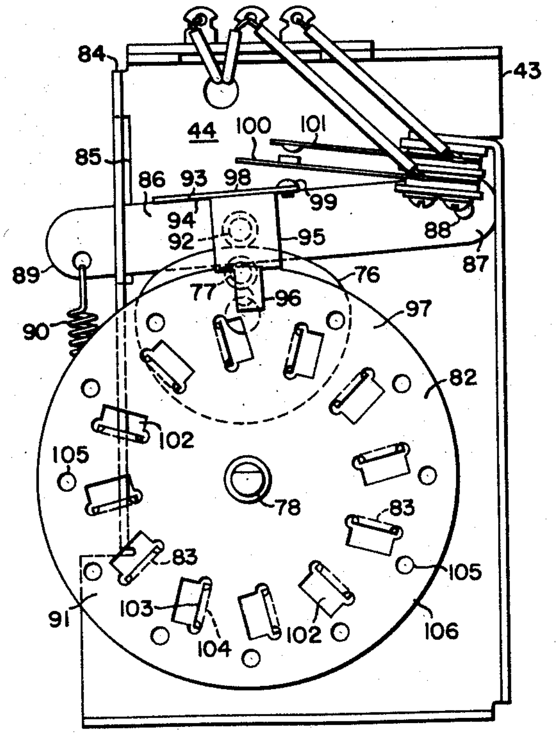
Fig. 3 is a front view of the drive mechanism of Fig. 2.

Referring to Figs. 2 and 3 in detail, a preferred channel-selection drive mechanism 41 comprises the motor 42 which is secured adjacent to the bracket 43 by means of two spaced support rods 51 and 52. The motor 42 is of the shaded-pole type having main windings 53 wound on the magnetic field structure or core 54, and a rotor 55. The rotor 55 is secured to the motor shaft 57 which has one part 58 journaled in bearings 59 and 60 and another integral part 61 whose free end is journaled in a bearing provided by an aperture in the bracket 43. The bearings 59 and 60 are connected to the core 54 by means of brackets 62 and 63.

A driving clutch member 64 is positioned adjacent to the bearing 59 near one end of the part 58 and secured in non-rotatable relation with respect to the motor shaft 57. The driving clutch member 64 is provided with a lateral projection 65. A driven clutch member 66, to which is attached a pinion 67, is slidably mounted on the part 61 of the motor shaft 57. A spacer 68 encircles a portion of the part 61 and prevents axial movement of the driven clutch member 66 and pinion 67 in the direction towards the rear of the bracket 43. The lateral projection 65 on the clutch member 64 is adapted to engage an outwardly projection portion 69 of the clutch member 66. A coil spring 70 is positioned between the clutch members 64 and 66, and this spring normally holds the clutch member 64 in such an axial position that the laterial projection 65 is out of engagement with the projecting portion 69 of the clutch member 66.

When the motor 42 is initially energized by closing of the switch 50 at the remote control unit 11, the motor shaft 57 will be rotated. At the same time the solenoid action of the motor will urge the motor shaft axially forward against the bias of the spring 70 in the direction towards the rear of the bracket 43. When the portion 58 of the motor shaft 57 is abutting the clutch member 66, the lateral projection 65 on the clutch member 64 will engage the projecting portion 69 on the clutch member 66. The pinion 67 will rotate at the speed of rotation of the motor shaft 57. Thus, when the motor 42 is initially energized, the clutch member 64 is moved to a coupling position with the clutch member 66, and when the motor is deenergized, the spring 70 instantly moves the clutch member 64 to a normally inoperative position.

The pinion 67 is connected to a gear wheel 71 which is keyed to a rotatable shaft 72 through a gear wheel 73 and pinion 74. The gear wheel 73 and pinion 74 are rotatably attached to an intermediate shaft 75. The shaft 75 is attached to the rear of the bracket 43. The gear wheel 71 is mounted adjacent the rear side of the bracket 43 at one end of the shaft 72. The shaft 72 extends through an aperture provided in the bracket 43. At the end of shaft 72 is secured a cam 76. The cam 76 is located adjacent to the front side of the bracket 43 in non-rotatable relation with respect to shaft 72. The cam 76 is generally heart-shaped and at substantially its low point is mounted a roller 77. A tuner driving shaft 78 is located adjacent the front of the bracket 43 and is supported in a bearing 79 located in an aperture provided in the bracket. The end of the tuner driving shaft 78 at the rear of the bracket is provided with a retaining ring 80 which holds the shaft 78 in a substantially fixed axial position with relation to the bracket 43. The end of the tuner driving shaft 78 adjacent the front of the bracket 43 has a cut-out portion 81 which is adapted to interlock with the part 18 of the tuner shaft 13 through the flexible coupling 40. The rotation of the tuner driving shaft 78 will therefore rotate the tuner shaft 13 to permit channel selection by means of the remote control unit 11.

To the rear of the cut-out portion 81 on the shaft 78 is attached a circular member 82 which is secured in non-rotatable relation with respect to the shaft 78. The circular member 82 is a modified Geneva wheel and is provided with a plurality of tabs 83 which extend rearwardly from the member in the direction of the front of the bracket 43. The number of tabs 83 provided corresponds to the number of channel detent positions of the tuner 12. At the top of the bracket 43 there is provided a flange portion 84 which is turned outwardly in the direction of the circular member 82. A substantially rectangular-shaped aperture 85 is provided in the flange portion 84.

The channel-selection drive mechanism 41 also comprises a lever 86 which has one end 87 pivotally connected to the front of the bracket 43, as by the fastener 88, and another end 89 which extends through the aperture 85 in the flange portion 84. The end 89 of the lever 86 is adapted to slide in the aperture 85 in a direction transverse to the plane of the bracket 43. A tension spring 90 is connected between the end 89 and the top of the bracket, as at 91. A roller 92 is attached to the lever 86 at substantially its mid-point. The lever 86 has a flange portion 93. At the inner side 94 of the flange portion 93 is attached a substantially L-shaped resilient member 95 having an end portion 96 which extends above the outer surface 97 of the circular member 82 and projects inwardly towards this outer surface. The outer side 98 of the flange portion 93 is provided with an insulated disc 99 adapted to bear against one segment 100 of the switch 44. The segment 100 is in turn adapted to bear against the other segment 101. The disc 99 is therefore adapted to close the switch 44 and thus keep motor 42 operating once it is energized by the closure of the switch 50 at the remote control unit 11. It will be seen that the switch 44 is connected in a holding circuit for the motor 42.

In the embodiment shown, the circular member 82 is provided with twelve spaced openings 102 which have a substantially rectangular configuration. The tabs 83 are formed of the material punched out of the circular member 82 to form these openings. Alternately, the tabs 83 may comprise attachments to the member 82. The tabs 83 extend inwardly in the direction towards the front of the bracket 43 and they have inner and outer surfaces 103 and 104. The roller 77 on the cam 76 is adapted to successively bear against the inner surfaces 103 of the tabs 83 to cause partial rotation of the circular member 82 and the tuner driving shaft 78. The circular member 82 is provided with twelve apertures 105, spaced so that there is one for each of the tabs 83. The apertures 105 are located between the openings 102 in the member 82 and the edge 106 of the circular member 82. A programming member may be inserted in one or more of the apertures 105 when it is desired that the circular member 82 by-pass a particular channel position.

The operation of the remote control system is as follows: Assuming that the circular member 82 is in a normal stop position, such as represented in Fig. 3, the roller 92 on the lever 86 is touching the edge of the cam 76 at its low point. The tuner driving shaft 78 is connected through the coupling 40 to the tuner shaft 13. The tuner shaft 13 is at a particular channel position. In this case, a different channel position may be locally selected by rotation of the tuner shaft 13. The tuner driving shaft 78 and circular member 82 are free to rotate as the roller 77 on the cam 76 is not in engagement with one of the tabs 83. To select a different channel position by means of the remote control unit 11, the push button switch 50 is depressed to initially energize the motor 42. The rotor 55 of the motor 42 starts to rotate which turns the motor shaft 57. The motor shaft 57 is caused to move axially towards the rear of the bracket 43. This axial movement is effected by the thrust or pull of the motor 42 on the rotor 55 and overcomes the pressure of the spring 70 to cause the clutch member 64 to engage the clutch member 66. The pinion 67 attached to the clutch member 66 drives the gear wheel 73 and pinion 74 which is free to rotate on the shaft 75. The pinion 74 in turn drives the gear wheel 71 at a reduced rate of speed with relation to the rate of speed of the motor shaft 57. The rotation of the gear wheel 71 causes the cam 76 to rotate and the roller 77 engages the outer surface 104 of one of the tabs 83 in a typical Geneva harmonic motion. This Geneva motion causes a partial rotation of the tuner drive shaft 78 which is coupled to the tuner shaft 14, moving the shaft 14 from one channel detent or predetermined position to a succeeding one.

The cam 76 is in its rest position when the roller 92 on the lever 86 is against the low point of the cam. One complete revolution of the cam 76 corresponds to a single channel movement of the tuner shaft 14. During its revolution, the edge of the cam 76 moves the roller 92 in a direction against the bias of spring 90 in a constant acceleration motion, causing the insulated disc 99 to close the segments 100 and 101 of the switch 44. As the cam 76 continues to rotate, it goes through a dwell period, holding the insulated disc 99 operative to keep the switch 44 closed. As the cam 76 rotates through the last portion of its revolution, the lever 86 moves in the direction towards the tuner driving shaft 78, aided by the action of the tension spring 90. At this period in the revolution of the cam 76, the insulated disc 99 ceases to hold the segments 100 and 101 of the switch 44 closed. If the operator at the remote control unit 11 has, previous to this time, ceased to depress the button which closes the switch 50, then the motor 42 will now be deenergized. The rotary momentum effect of the rotor 55 on the tuner drive shaft 78 is removed by declutching the motor shaft 57 from the clutch member 66 through the action of the spring 70. The spring 70 instantly forces the motor shaft 57 axially away from the clutch member 66, since there is now no solenoid action in the deenergized motor. The rotary momentum of the gear wheels 71 and 73 on the tuner drive shaft 78 is overcome by the braking action of the roller 92 on the edge of the cam 76 at its low point. The entire channel-selection drive mechanism 41 comes to a complete stop in a precisely determined position, that is, with the roller 92 in contact with the edge of the cam 76 at its minimum radius position or low point. In this position the tuner driving shaft 78, which is coupled in the tuner shaft 13, is free to rotate permitting complete local operation of the tuner 12.

As described above, one revolution of the cam 76 corresponds to one tuner channel movement. Corresponding to the cam revolution is the transverse movement of the lever 86. When the roller 77 on the cam 76 disengages a tab 83, the lever 86 starts to move in the direction towards the tuner driving shaft 78. If a programming member is provided in the next one of the apertures 105, the lever 86 will be prevented from moving under the action of spring 90 to a point where the insulated disc 99 will no longer bear against the switch segment 100. This is effected by means of the end portion 96 of the member 95 abutting the programming member and arresting the motion of the spring 90. The lever 86 is held in position so that the switch 44 remains closed and the motor 42 continues to be energized, causing the cam 76 to go through another cycle of operation without stopping.

It will be apparent from the above description that for any channel position which it may be desirable to by-pass, a corresponding programming member may be placed in the appropriate aperture 105 on the circular member 82. If the tuner 12, through local operation, is inadvertently left in a programmed channel position, the operation of the channel-selection drive mechanism 41 may tend to jam the end portion 96 of the member 95 under a programming member on the side of the programming member adjacent one of the openings 102 in the circular member 82. For this reason, the end portion 96 is made of spring material with a long cantilever action, and it is so designed as to ride over the top of the programming member on the outward stroke of the lever 86 in the direction away from the tuner driving shaft 78.

Figure 4:
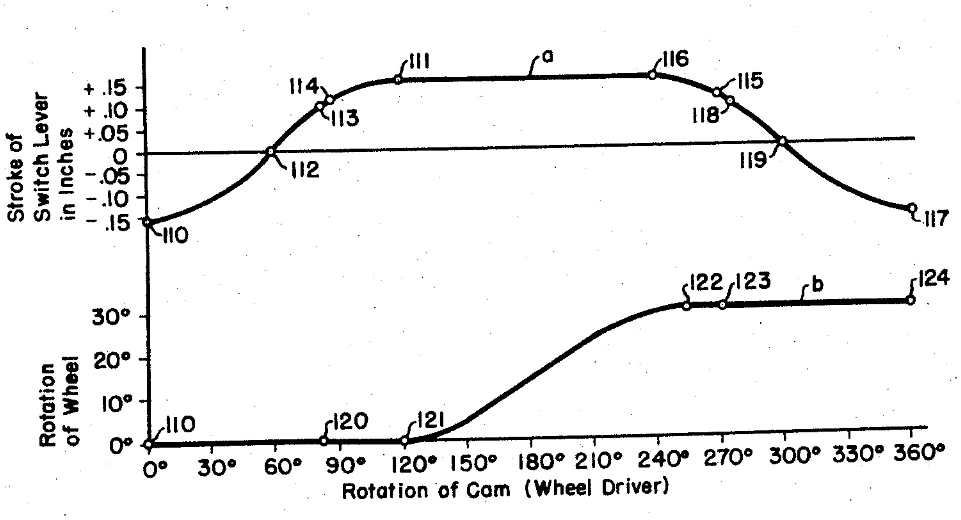
Fig. 4 shows a set of curves helpful in explaining our invention.

In Fig. 4, curve *a* represents a plot of the rotation of the cam 76 in degrees against the stroke of the lever 86 in inches. At the greatest minus value of curve *a*, the lever 86 would be in the rest position as shown in Fig. 3, and the tuner shaft 13 would be at a channel position. In Fig. 4, curve *b* represents a plot of the rotation of cam 76 in degrees against the rotation of the circular member 82 and tuner driving shaft 78 in degrees. At point 110 on both curves of Fig. 4, the cam 76 will be in its rest position. From point 110 to point 111 on curve *a*, there will be constant outward acceleration of the stroke of the lever 86. Between points 112 and 113, the insulating disc 99 on the lever 86 will close the segments 100 and 101 of the switch 44. At point 114, the end portion 96 of the member 95 will leave a programming member, and at point 115 the end portion 96 will abut the next succeeding programming member if one is provided at that location. From point 116 to point 117, there is again constant acceleration of the stroke of the lever 86 but in an inward direction. Between points 118 and 119, the insulating disc 96 will move away from the segment 100, and the switch 44 will open, causing deenergization of the motor 42. On curve *b*, at point 120, the roller 77 on the cam 76 will be adjacent the inner side 103 of the circular member 82. At point 121, the roller 77 will contact a tab 83, and at point 122, the roller 77 will disengage from the tab. From points 121 to 122, the roller 77 engages a tab 83 in a Geneva harmonic motion. At point 123, the roller 77 will no longer be adjacent the inner side 103 of the circular member 82, and at point 124, the circular member 82 and the tuner driving shaft 78 will have rotated substantially 30° which corresponds to a single channel movement of the tuner 12.

While we have shown our invention in a preferred form, it will be obvious to those skilled in the art that it is not so limited but is susceptible of various changes and modifications without departing from the spirit and scope thereof.

We claim as our invention:

1. In apparatus for controlling the angular movement of a shaft, the combination of, a first rotary shaft, a member movable with said shaft and coaxial therewith, said member having a plurality of radially spaced tabs, a second rotary shaft having a gearing and a cam movable with said second shaft, means associated with said cam for contacting said tabs to move angularly said first shaft a predetermined amount, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, and cam operated switch means for closing said holding circuit in response to actuation of said cam until the angular movement of said first shaft has progressed substantially said predetermined amount, said last-mentioned means including a part thereof in contact with said cam.

2. In apparatus for controlling the angular movement of a shaft, the combination of a first rotary shaft, a member movable with said shaft and coaxial therewith, said member having a plurality of radially spaced tabs extending from one side thereof, a second rotary shaft having a gearing and a cam movable with said second shaft, means associated with said cam for contacting said tabs to move angularly said first shaft to a predetermined position, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, and cam following switch means in contact with said cam for closing said holding circuit in response to actuation of said cam, said last-mentioned means also including means for making said holding circuit ineffective and for locating said first shaft at said predetermined position after said holding circuit is made ineffective.

3. In apparatus for controlling the angular movement of a shaft, the combination of a first rotary shaft, a member movable with said shaft and coaxial therewith, said member having a plurality of radially spaced tabs extending from one side thereof, a second rotary shaft having a gearing and a cam movable with said second shaft, means associated with said cam for contacting said tabs to move angularly said first shaft to a predetermined position, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, cam follower switch means in contact with said cam for closing said holding circuit in response to actuation of said cam, said last-mentioned means also including means for making said holding circuit ineffective and for locating said first shaft at said predetermined position after said holding circuit is made ineffective, and means for automatically disengaging the means carried by said motor shaft from the gearing on said second shaft after said holding circuit is made ineffective.

4. In an arrangement for remote control of the tuning control shaft of a television receiver, said control shaft adapted to be actuated to a plurality of predetermined positions, the combination of a first rotary shaft coupled to said control shaft, a member rotatable with said first shaft having a plurality of radially spaced tabs extending from one side thereof and corresponding in number to the number of said predetermined positions, a second rotary shaft carrying a gearing, said second shaft also carrying cam means for successively contacting said tabs to move said first shaft and said control shaft to a particular one of said predetermined positions, said gearing and said contacting means being rotatable with said second shaft, an electric motor having a motor shaft axially movable to a predetermined limit of travel upon operation of said motor, means carried by said motor shaft for engaging said gearing when said motor shaft reaches said predetermined limit of travel, a circuit for said motor having means located at a point remote from said receiver for initiating the operation of said motor, a holding circuit for said motor, cam follower switch means in contact with said contacting means for closing said holding circuit in response to a particular actuation of said engaging means, said last-mentioned means also including means for making said holding circuit ineffective in response to a further actuation of said contacting means and for locating said control shaft at said one predetermined position after said holding circuit is made ineffective, and means for automatically disengaging the means carried by said motor shaft from the gearing on said second shaft after said holding circuit is made ineffective.

5. In apparatus for controlling the angular movement of a shaft, the combination of a first rotary shaft, a circular member movable with said first shaft, said circular member having a plurality of radially spaced tabs, each of said tabs representing a final position of said first shaft, a second rotary shaft having a gearing and a cam movable with said second shaft, means associated with said cam adapted to contact successively said tabs to move angularly said first shaft to a predetermined final position, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, and cam follower switch means in contact with said cam for closing said holding circuit in response to a particular actuation of said cam, said last-mentioned means also including means for making said holding circuit ineffective in response to a further actuation of said cam and for locating said first shaft at said predetermined final position after said holding circuit is made ineffective.

6. In apparatus for controlling the angular movement of a shaft, the combination of a first rotary shaft, a circular member movable with said first shaft, said circular member having a plurality of radially spaced tabs, each of said tabs representing a final position of said first shaft, a second rotary shaft having a gearing and a cam movable with said second shaft, means associated with said cam adapted to contact successively said tabs to move angularly said first shaft to a predetermined final position, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, switch means in contact with said cam for closing said holding circuit in response to a particular actuation of said cam, said last-mentioned means also including means for making said holding circuit ineffective in response to a further actuation of said cam and for locating said first shaft at said predetermined final position after said holding circuit is made ineffective, and means for automatically disengaging the means carried by said motor shaft from the gearing on said second shaft after said holding circuit is made ineffective.

7. In apparatus for controlling the angular movement of a shaft, the combination of a first rotary shaft, a circular member movable with said shaft, said circular member having a plurality of radially spaced tabs, each of said tabs representing a final position of said first shaft, a second rotary shaft having a gearing and a cam movable with said second shaft, means associated with said cam adapted to engage successively said tabs to move angularly said first shaft to a predetermined final position, an electric motor having a motor shaft axially movable to a predetermined limit of travel upon operation of said motor, means carried by said motor shaft for engaging said gearing when said motor shaft reaches said predetermined limit of travel, a circuit for said motor having means located at a point remote from said first shaft for initiating the operation of said motor, a holding circuit for said motor, switch means in contact with said cam for closing said holding circuit in response to a particular actuation of said cam, and means cooperating with said closing means for retaining said holding circuit closed until said first shaft is moved close to said predetermined final position, said closing means also including means for making said holding circuit ineffective in response to a further actuation of said cam and for locating said first shaft at said predetermined final position after said holding circuit is made ineffective.

8. In apparatus for controlling the angular movement of a shaft, the combination of, a first rotary shaft, a member movable with said shaft and coaxial thereof, said member have a plurality of radially spaced tabs extending from one side thereof, a second rotary shaft having a gearing and a cam movable with said second shaft, means associated with said cam for contacting said tabs to move angularly said first shaft a predetermined amount, an electric motor having a motor shaft, means carried by said motor shaft for engaging said gearing, a circuit for said motor having means for initiating the operation of said motor, a holding circuit for said motor, and switch means positioned so as to be actuated by said cam means for closing said holding circuit in response to actuation of said cam until the angular movement of said first shaft has progressed said predetermined amount, said last-mentioned means including a cam follower in contact with said cam.

9. In apparatus for controlling the angular movement of a shaft, the combination of, a first rotary shaft, a member movable with said shaft and coaxial thereof, said member having a plurality of radially spaced tabs extending from one side thereof, a second rotary shaft having a gearing and a cam movable with said second shaft, means associated with said cam for contacting said tabs to move angularly said first shaft a predetermined amount, an electric motor having a motor shaft, means carried by said motor shaft for engaging said gearing, a circuit for said motor having means for initiating the operation of said motor, a holding circuit for said motor, and switch means positioned so as to be actuated by said cam means for closing said holding circuit in response to one actuation of said cam and for making said holding circuit ineffective in response to a further actuation of said cam to locate said first shaft at said predetermined position when said holding circuit is made ineffective, said last-mentioned means including a cam follower in contact with said cam.

References Cited in the file of this patent

UNITED STATES PATENTS

| | | |
|---|---|---|
| 2,204,065 | Beizer et al. | June 11, 1940 |
| 2,445,031 | McDonald | July 13, 1948 |
| 2,702,609 | Frazier | Feb. 22, 1955 |
| 2,760,139 | Luebking | Aug. 21, 1956 |

FOREIGN PATENTS

| | | |
|---|---|---|
| 118,168 | Australia | Mar. 9, 1944 |
| 125,512 | Australia | Oct. 2, 1947 |

OTHER REFERENCES

Rider Television Manual, vol. 8, pages: "Philco TV," page "8-1 to "8-4." Published November 26, 1951.